(12) United States Patent
Yu et al.

(10) Patent No.: US 9,548,209 B2
(45) Date of Patent: Jan. 17, 2017

(54) METHOD FOR INTEGRATED CIRCUIT FABRICATION

(71) Applicant: Taiwan Semiconductor Manufacturing Company, Ltd., Hsin-Chu (TW)

(72) Inventors: Ching-Fang Yu, Hsinchu (TW); Chia-Ching Huang, Yilan County (TW); Ting-Hao Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/625,341

(22) Filed: Feb. 18, 2015

(65) Prior Publication Data

US 2015/0162204 A1    Jun. 11, 2015

Related U.S. Application Data

(63) Continuation of application No. 14/045,963, filed on Oct. 4, 2013, now Pat. No. 8,980,108.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/308* | (2006.01) |
| *H01L 21/263* | (2006.01) |
| *G03F 7/20* | (2006.01) |
| *H01L 21/027* | (2006.01) |

(52) U.S. Cl.
CPC .......... *H01L 21/3086* (2013.01); *G03F 7/203* (2013.01); *G03F 7/70433* (2013.01); *G03F 7/70466* (2013.01); *H01L 21/2633* (2013.01); *H01L 21/3088* (2013.01); *H01L 21/0274* (2013.01)

(58) Field of Classification Search
CPC .......... G03F 7/23; G03F 7/70; G03F 7/70433; G03F 7/70466; H01L 21/3088; H01L 21/3086
USPC ..................................... 216/13, 41
See application file for complete search history.

(56) References Cited

U.S. PATENT DOCUMENTS

| | | |
|---|---|---|
| 7,123,348 B2 | 10/2006 | Troost et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |

(Continued)

*Primary Examiner* — Roberts Culbert
(74) *Attorney, Agent, or Firm* — Haynes and Boone, LLP

(57) ABSTRACT

Provided is an integrated circuit (IC) fabrication method. The method includes receiving a mask, the mask having a plurality of dies and receiving a wafer, the wafer having a resist layer. The method further includes exposing the resist layer using the mask with a fraction radiation dose thereby forming a first plurality of images; re-positioning the mask relative to the wafer; and exposing the resist layer using the mask with another fraction radiation dose. A second plurality of images is formed, wherein a portion of the second plurality of images is superimposed over another portion of the first plurality of images.

19 Claims, 11 Drawing Sheets

(56) References Cited

U.S. PATENT DOCUMENTS

| | | |
|---|---|---|
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2002/0197565 A1* | 12/2002 | Wu .............................. 430/311 |

* cited by examiner

METHOD FOR INTEGRATED CIRCUIT FABRICATION

This is a continuation of U.S. Ser. No. 14/045,963 filed Oct. 4, 2013, the entire disclosure of which is hereby incorporated by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, extreme ultraviolet (EUV) lithography has been utilized to support critical dimension (CD) requirements of smaller devices. EUV lithography employs scanners using radiation in the EUV region, having a wavelength of about 1-100 nm. Some EUV scanners provide 4× reduction projection printing, similar to some optical scanners, except that the EUV scanners use reflective rather than refractive optics, e.g., mirrors instead of lenses. Masks used in EUV lithography present new challenges. For example, an EUV mask generally uses a multi-layer (ML) structure over a substrate and a microscopic non-flatness of the substrate may deform the ML structure deposited subsequently thereon. When an incident EUV radiation is reflected from a deformed region, it may experience a phase difference with respect to a radiation reflected from a normally formed region. Such mask defects are commonly referred to as phase defects. A phase defect may affect print fidelity and result in reduced image intensity or even pattern distortion on a wafer. Certain compensation methods, such as requiring tighter process controls for mask production or repairing mask defects, may be utilized. These compensation methods, however, may significantly increase mask fabrication time and cost. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
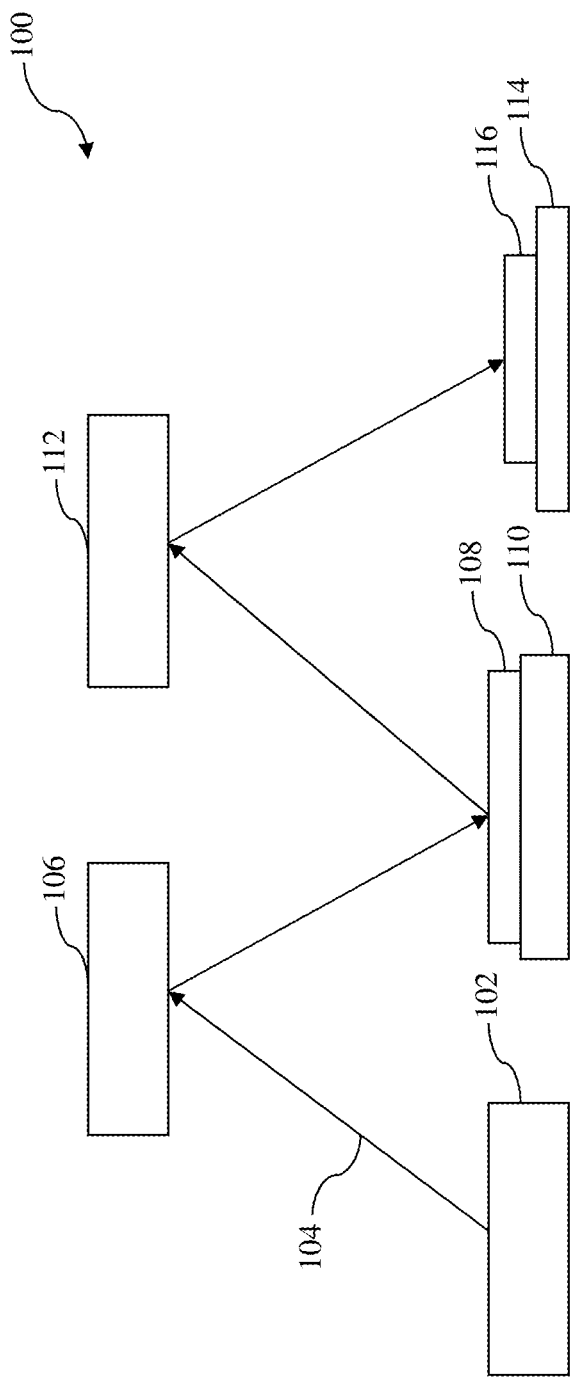
FIG. 1 is a diagram of an extreme ultraviolet (EUV) lithography exposing system that can benefit from one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to evolve, lithography processes have been utilized to achieve increasing functional densities and decreasing feature sizes. One form of lithography is extreme ultraviolet (EUV) lithography that utilizes EUV masks. The EUV masks, however, may include various defects such as embedded particles or multilayer defects which adversely affect semiconductor devices that are formed using EUV masks that include such defects. To minimize these defects, various approaches have been implemented. For example, tighter tolerances may be placed on mask making processes to reduce or eliminate mask defects, with the tradeoff of higher mask cost. Further, masks with defects may be repaired by various high cost processes once defects are observed. In contrast, as will be evident from the discussion that follows, the present disclosure provides for embodiments of methods and apparatus that address these concerns without the additional cost associated with the above approaches.

FIG. 1 shows an exemplary EUV lithography system 100 that can benefit from one or more embodiments of the present disclosure. The system 100 includes a radiation source 102 that produces a radiation beam 104, condenser optics 106, a mask 108 on a mask stage 110, projection optics 112, and a substrate 116 on a substrate stage 114. Other configurations and inclusion or omission of items may be possible. In the present disclosure, the system 100 may be a stepper or a scanner.

The radiation source 102 provides the radiation beam 104 having a wavelength in the EUV range, such as about 1-100 nm. In an embodiment, the radiation beam 104 has a wavelength of about 13.5 nm.

The condenser optics 106 includes a multilayer coated collector and a plurality of grazing mirrors. The condenser optics 106 is configured to collect and shape the radiation beam 104 and to provide a slit of the radiation beam 104 to the mask 108.

The mask 108, also referred to as a photomask or a reticle, includes patterns of one or more target IC devices. The mask 108 provides a patterned aerial image to the radiation beam 104. The mask 108 can be a transmissive mask or a reflective mask. In the present embodiment, the mask 108 is a reflective mask which will be described in further detail below. The mask 108 may incorporate other resolution enhancement techniques such as phase-shifting mask (PSM) and/or optical proximity correction (OPC).

The mask stage 110 secures the mask 108 thereon, such as by vacuum, and provides accurate position and movement of the mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the mask 108 to the substrate 116.

The substrate 116 includes a semiconductor wafer with a photoresist (or resist) layer, which is sensitive to the radiation beam 104. The substrate 116 is secured by the substrate stage 114 which provides accurate position and movement of the substrate 116 during alignment, focus, leveling and exposing operation in the EUV lithography system 100 such that the patterned aerial image of the mask 108 is exposed onto the substrate 116 in a repetitive fashion (though other lithography methods are possible).

After the substrate 116 is exposed to the radiation beam 104, it is moved to a developer where areas of the photoresist layer of the substrate 116 are removed based on whether the area is exposed to the radiation beam 104, thereby transferring the patterns from the mask 108 to the substrate 116. In some embodiments, a developer includes a water based developer, such as tetramethylammonium hydroxide (TMAH), for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying a developer on the exposed resist film, for example, by a spin-on process. Applying a developer also includes using a post exposure bake (PEB) process, a post develop bake (PDB) process, or a combination thereof. The developed or patterned photoresist layer is used for further processing the substrate 116 in order to form the target IC device. For example, one or more layers of the substrate 116 may be etched with the patterned photoresist layer as an etch mask.

As discussed above, a defect in the mask 108 may cause the radiation beam 104 to be out of phase or scattered in or around a defective region of the mask 108, subjecting areas of the photoresist layer on the substrate 116 to overexposure or underexposure. That in turn may produce pattern fidelity errors in the target IC device. The present disclosure provides embodiments for mitigating such an effect.

Figure 2:
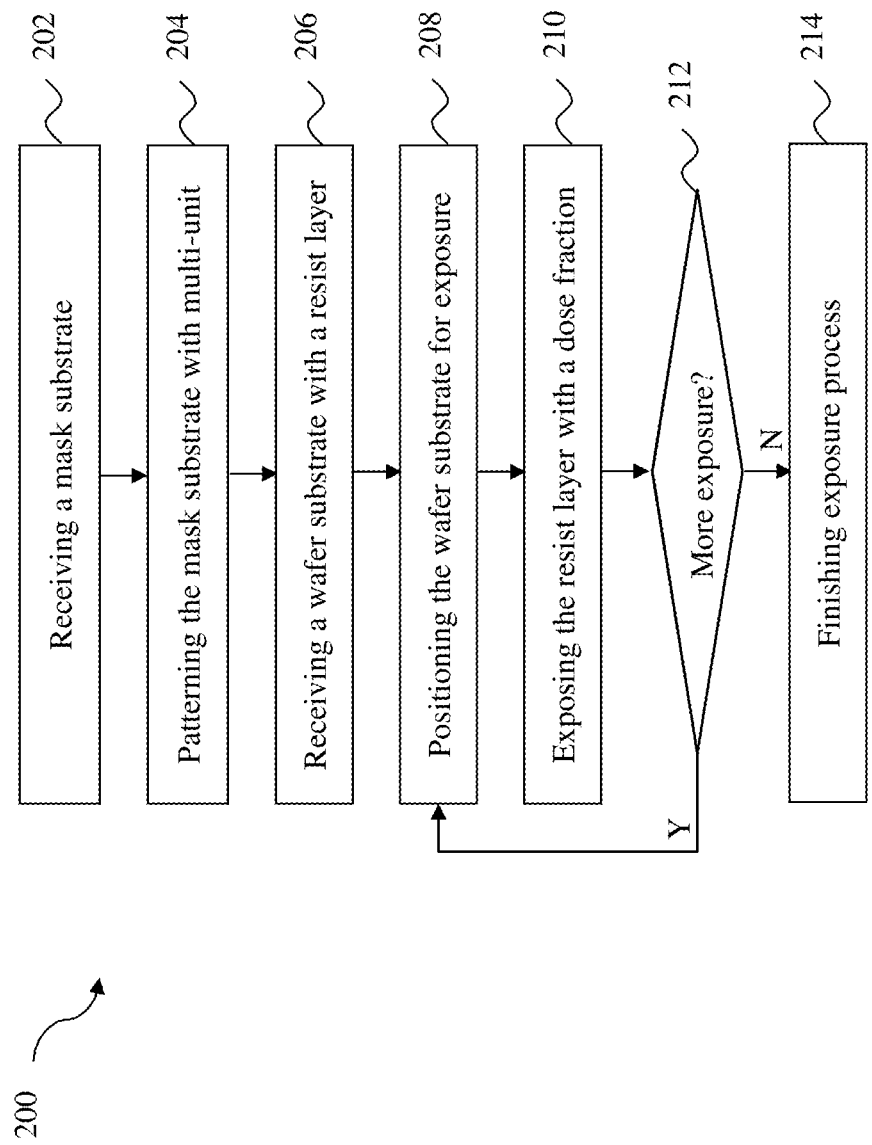
FIG. 2 is a flowchart illustrating a method of exposing a semiconductor wafer for fabricating ICs according to various aspects of the present disclosure.

FIG. 2 is a flow chart of a method 200 of exposing a semiconductor wafer using photolithography according to various aspects of the present disclosure. The method 200 may be implemented, in whole or in part, by a EUV lithography system, such as the system 100. The method 200 is described below in conjunction with FIGS. 3A-6C.

The method 200 (FIG. 2) begins at operation 202 where a mask substrate 300 (FIGS. 3A and 3B) is received or provided. In the present embodiment, the mask substrate 300 is a EUV mask substrate. The EUV mask substrate 300 may be provided by the same manufacturer that utilizes the EUV mask substrate 300 to fabricate integrated circuit devices. Alternatively, the EUV mask substrate 300 may be received from a vendor, which may be a third party. Ideally, the EUV mask substrate 300 should be free of defects. In reality, this is hardly so.

Figure 3A:
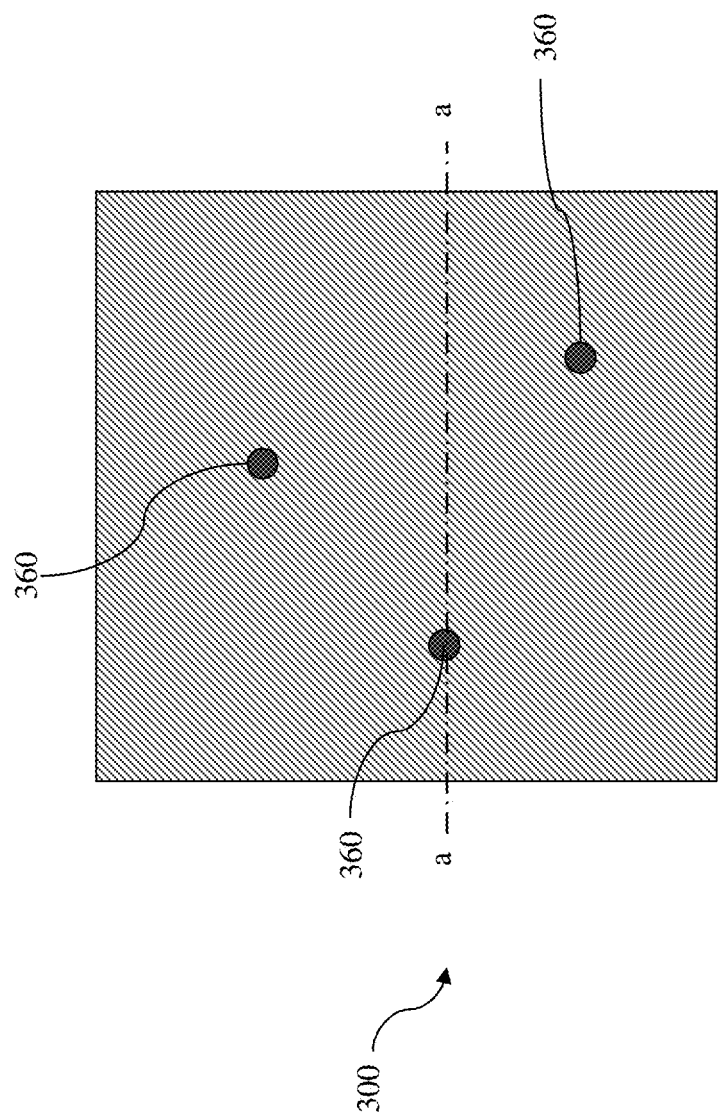
FIGS. 3A and 3B illustrate top and cross sectional views of an embodiment of an EUV mask substrate according to various aspects of the present disclosure.

Referring to FIG. 3A, in the present embodiment, the EUV mask substrate 300 includes one or more defects 360. The defects 360 may be bump defects or pit defects or a combination thereof. The defects 360 may vary in location, shape, size, depth, orientation, etc.

Figure 3B:
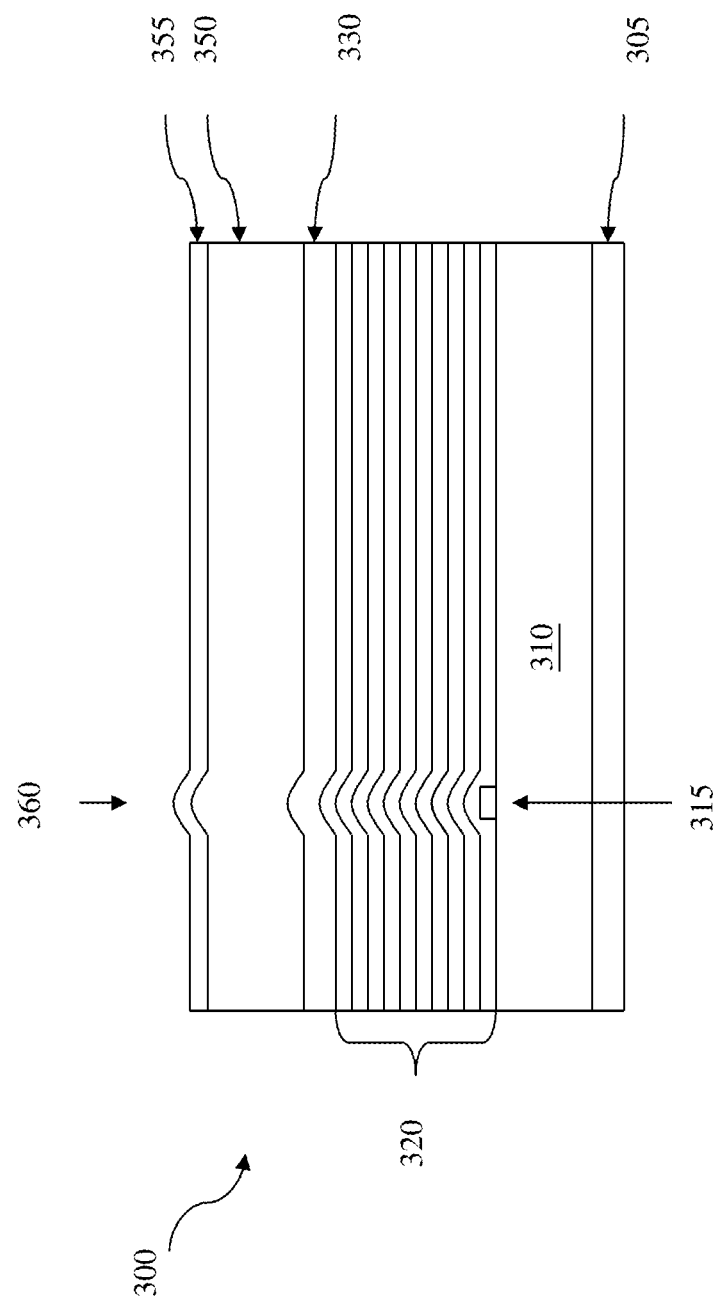

FIG. 3B provides a cross-sectional view of the EUV mask substrate 300 taken along line a-a of FIG. 3A. Referring to FIG. 3B, the EUV mask substrate 300 includes a material layer 310, a reflective multilayer (ML) 320 deposited over the material layer 310, a capping layer 330 deposited over the reflective ML 320, an absorber layer 350 deposited over the capping layer 330, and a protection layer 355 deposited over the absorber layer 350. In addition, a conductive layer 305 may be deposited under the material layer 310, as shown in FIG. 3B, for electrostatic chucking purposes. In an embodiment, the conductive layer 305 includes chromium nitride (CrN). Other configurations and inclusion or omission of various items in the EUV mask substrate 300 may be possible.

The material layer 310 includes low thermal expansion material (LTEM), serving to minimize image distortion due to mask heating by intensified EUV radiation. The LTEM may include fused silica, fused quartz, calcium fluoride ($CaF_2$), silicon carbide, silicon oxide-titanium oxide alloy and/or other suitable LTEM.

The reflective multilayer (ML) 320 is deposited over the LTEM material layer 310. The ML 320 includes a plurality of film pairs, such as molybdenum-silicon (Mo/Si) film pairs (e.g., a layer of molybdenum above or below a layer of silicon in each film pair). Alternatively, the ML 320 may include molybdenum-beryllium (Mo/Be) film pairs, or any two materials or two material combinations with large difference in refractive indices and small extinction coefficients. The thickness of each layer of the ML 320 depends on the wavelength and an incident angle of the EUV radiation 104. For a specified incident angle, the thickness of each layer of the ML 320 may be adjusted to achieve maximal constructive interference for radiations reflected at different interfaces of the ML 320. A typical number of film pairs are 20-80, however any number of film pairs are possible. In an embodiment, the ML 320 includes 40 pairs of layers of Mo/Si. Each Mo/Si film pair has a thickness of about 7 nm, e.g., about 3 nm for Mo and about 4 nm for Si. In this case, a reflectivity of about 70% is achieved.

The capping layer 330 is deposited over the ML 320. The capping layer 330 has different etching characteristics from the absorber layer 350 and acts as an etching stop layer in a patterning or repairing process of the absorber layer 350. In the present embodiment, the capping layer 330 includes ruthenium (Ru) or Ru compounds such as ruthenium-boron (RuB) or ruthenium-silicon (RuSi).

The absorber layer 350 is deposited over the capping layer 330. In the present embodiment, the absorber layer 350 absorbs the EUV radiation beam 104 projected thereon. The absorber layer 350 may include a single layer or multiple layers from a group of chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), or other suitable materials.

The protection layer 355 is deposited over the absorber layer 350, for example, to protect the absorber layer 350 from oxidation when the mask substrate 300 is in a cleaning process. Furthermore, some of the absorber layer 350 may have poor cleaning resistance and the protection layer 355 can enhance the cleaning durability of the EUV mask substrate 300. In the present embodiment, the protection layer 355 includes tantalum boron oxide (TaBO).

One or more of the layers 305, 320, 330, 350 and 355 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods.

Referring again to FIG. 3B, in the present embodiment, one of the mask defects 360 is caused by a buried bump defect 315, on the surface of the LTEM material layer 310. In an embodiment, a bump defect may be embedded in the ML 320. The defect 315 may be formed when fabricating the LTEM material layer 310 or the ML 320, or during other processes. In other embodiments, the EUV mask substrate 300 may include pit defects or a combination of bump defects and pit defects. Either a bump defect or a pit defect changes profile of the multilayer surface and therefore distorts a reflected radiation beam from the multilayer surface. In some embodiments, a defect in a reflective ML of a reflective EUV mask, such as the defect 360, is also referred to as a phase defect.

The method 200 (FIG. 2) proceeds to operation 204 where the EUV mask substrate 300 is patterned with an IC design layout. Particularly, the EUV mask substrate 300 is patterned with a multi-unit configuration.

An IC design layout includes various geometrical patterns designed for the IC product, based on a specification of the IC product to be manufactured. The geometrical patterns correspond to patterns of metal, oxide, or semiconductor layers that make up the various components of the IC device to be fabricated. The various layers combine to form various IC features. For example, a portion of an IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. An IC design layout is presented in one or more data files having information of the geometrical patterns, such as a GDSII file or DFII file. An IC design layout includes multiple layers of patterns with each layer to be patterned onto a mask. For example, fabricating a complex IC may require 30 to 50 masks.

In the present embodiment, the mask substrate 300 is patterned with one such IC layer. Moreover, multiple copies of the same IC layer are patterned onto the mask substrate 300 in a multi-unit configuration where each unit is a mask pattern corresponding to one copy of the IC layer. A unit can represent a die, a subset of a die, or multiple dies.

Figure 4A:
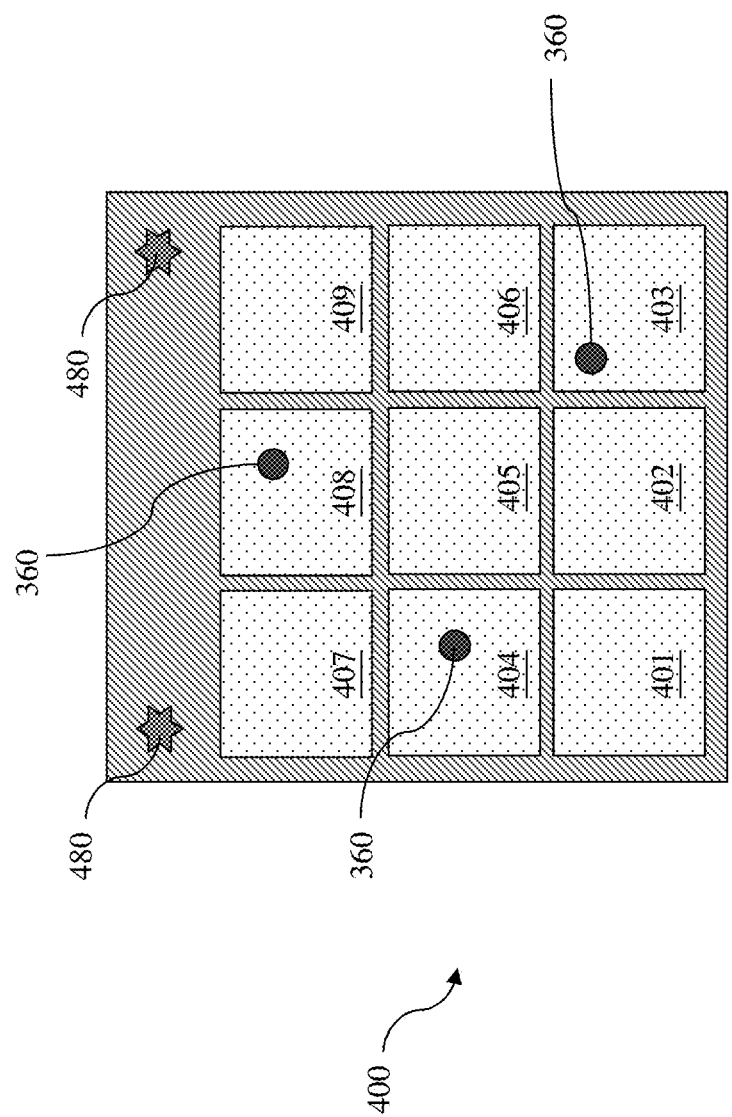
FIGS. 4A and 4B illustrate top and cross sectional views of an embodiment of a patterned EUV mask according to various aspects of the present disclosure.

Referring to FIG. 4A, in the present embodiment, the EUV mask substrate 300 is patterned with 9 units, 401-409, in a 3×3 configuration (an array with three columns and three rows) and becomes a patterned EUV mask 400. As discussed above, the defects 360 may be randomly located within the mask substrate 300. For illustrative purposes, the units 403, 404 and 408 happen to be patterned in defective regions of the mask substrate 300. The patterned EUV mask 400 further includes various alignment marks 480 in an alignment region, circumscribing a central portion of the mask where the units are formed. The alignment marks 480 may have any appropriate shape, form, size, etc. The alignment marks 480 can be aligned to a coordinate system of a radiation beam writer, such as an electron beam writer, prior to pattern writing.

Patterning the EUV mask substrate 300 may include lithography and etching processes. A lithography process may include resist coating (e.g., spin-on coating), soft baking, mask aligning, exposure, post-exposure baking, developing the resist, rinsing, drying (e.g., hard baking), other suitable processes, and/or combinations thereof. The exposure is accomplished by electron beam direct writing or multiple electron beam direct writing. The e-beam writing process may be implemented in a raster scan mode or a vector scan mode. The e-beam may be Gaussian beam or shaped beam. Next, an etching process is performed to remove portions of the protection layer 355 and the absorber layer 350. The etching process may include dry (plasma) etching, wet etching, and/or other etching methods. Subsequent to the etching process, additional processing such as chemical mechanical polishing (CMP) processes, cleaning processes, or other suitable process may be performed.

Figure 4B:
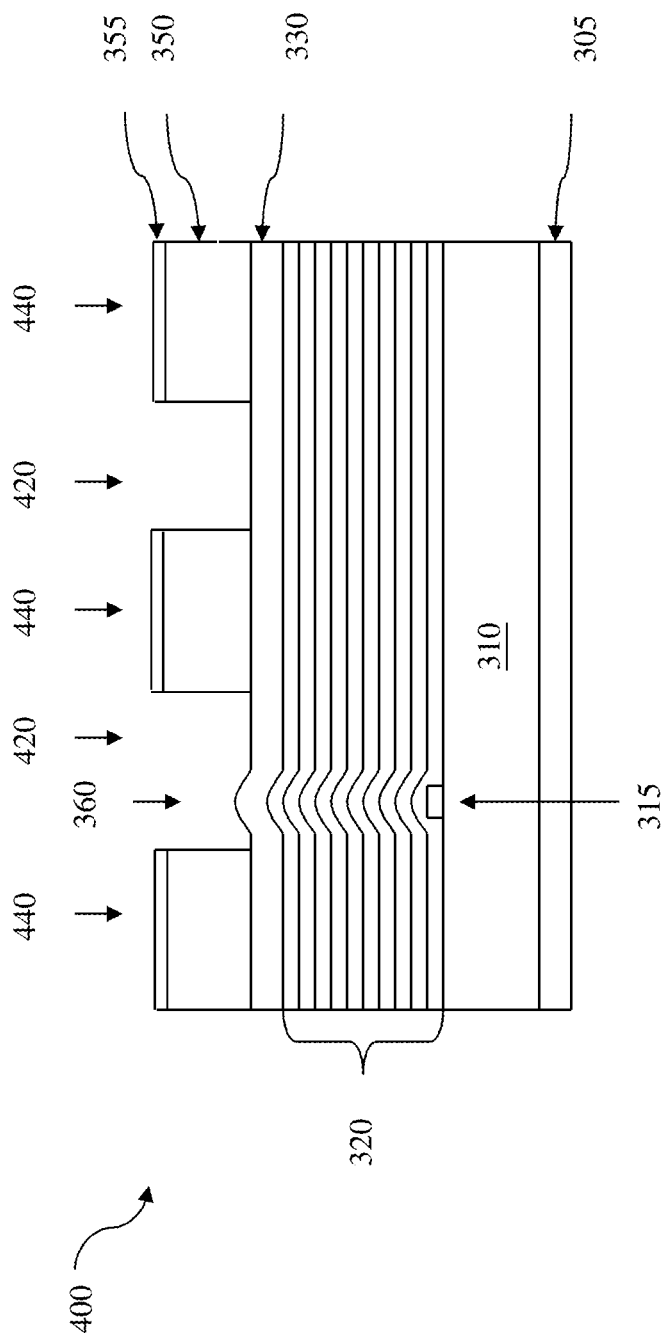

FIG. 4B shows a cross-sectional view of a portion of the patterned EUV mask 400. Referring to FIG. 4B, the patterned EUV mask 400 includes absorptive regions 440 and reflective regions 420. At least one of the reflective regions 420 includes one of the phase defects 360.

The method 200 (FIG. 2) proceeds to operation 206 where a wafer is received or provided and the wafer includes a substrate and a photoresist (or resist) layer formed over the substrate.

Figure 5:
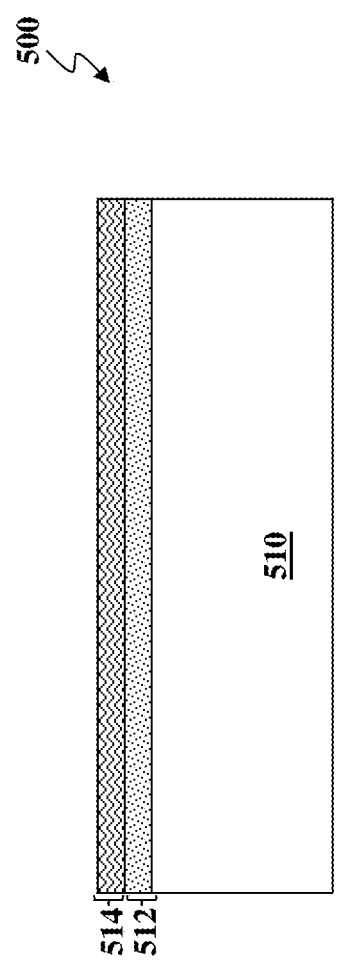
FIG. 5 illustrates a cross sectional view of an embodiment of a semiconductor wafer according to various aspects of the present disclosure.

Referring to FIG. 5, a diagrammatic cross-sectional side view of a wafer 500 (such as a semiconductor wafer) is illustrated. The wafer 500 has been simplified for the sake of clarity to better understand the inventive concepts of the present disclosure. Additional features can be added in the wafer 500, and some of the features described below can be replaced or eliminated in other embodiments of the wafer 500.

Still referring to FIG. 5, the wafer 500 includes a substrate 510. The substrate 510, for example, can be a bulk substrate or a silicon-on-insulator (SOI) substrate. The substrate 510 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. A SOI substrate can be fabricated using separation by implantation of oxygen (SIMOX), wafer bonding, and/or other suitable methods. The substrate 510 may be a p-type substrate, an n-type substrate, or a combination thereof. Although the present disclosure provides various examples of a substrate, the scope of the disclosure and claims should not be limited to the specific examples unless expressly claimed.

Still referring to FIG. 5, the substrate 510 includes one or more layers 512 to be patterned. The layers may be, for example, dielectric layers, non-dielectric layers, metal layers, etc. The one or more layers 512 may be formed by chemical vapor deposition (CVD), physical vapor deposition (PVD), atomic layer deposition (ALD), high density plasma CVD (HDPCVD), plating, other suitable methods, and/or combinations thereof. Formed over the layers 512 is a resist layer 514. The resist layer 514 includes a material sensitive to EUV processing. The resist layer 514 may be formed by a spin coating process or any suitable process. Other steps may be further implemented after the coating of the resist layer 514. For example, a baking process may be applied to the resist layer 514 to partially drive out solvents (used in the spin coating process) from the resist layer 514.

The method 200 (FIG. 2) proceeds to operation 208 where the wafer 500 is positioned on a stage, such as the stage 114 (FIG. 1), to take EUV exposure with the patterned EUV mask 400. In an embodiment, either the wafer 500, or the patterned EUV mask 400, or both of them may be moved and aligned during the EUV exposure process in a EUV lithography system, such as the system 100 (FIG. 1). After the wafer 500 and the mask 400 are positioned properly, the method 200 (FIG. 2) proceeds to operation 210 to expose the wafer 500 with a dose of the EUV radiation beam 104.

Figure 6C:
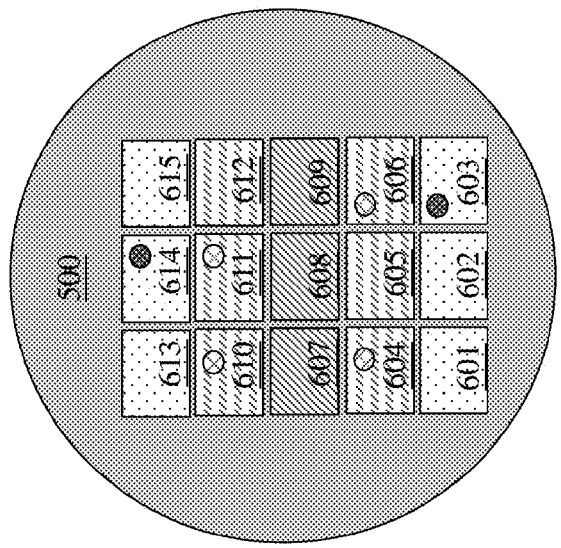
FIGS. 6A-6C illustrate a wafer multi-exposure process using a multi-unit EUV mask according to various aspects of the present disclosure.
Figure 6B:
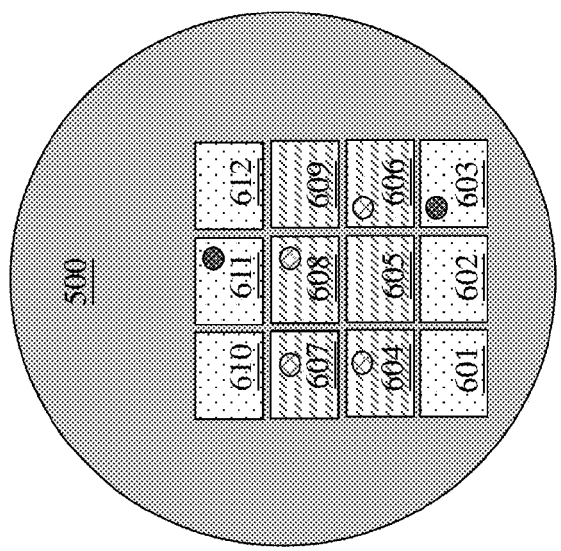
Figure 6A:
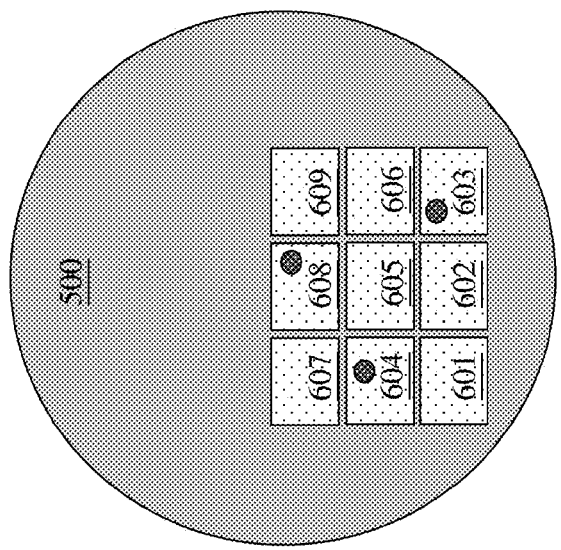

FIG. 6A shows the wafer 500 after a first exposure. Referring to FIG. 6A, the wafer 500 are exposed to the EUV radiation beam 104 with the patterned EUV mask 400 thereby forming nine images, 601-609, on the resist layer 514. The nine images, 601-609, correspond to the nine units, 401-406 (FIG. 4A), respectively. In the present embodiment, the dose of the EUV radiation beam 104 is controlled such that only one third of a full dose is used in the first exposure. In an embodiment, the resist layer 514 is a EUV high sensitivity resist and a full dose (energy required to fully expose the resist layer 514) is about 15 to 20 millijoule per square centimeter ($mJ/cm^2$).

The method 200 (FIG. 2) proceeds to operation 212. If the wafer 500 has been fully exposed or at least one image on the wafer 500 has been fully exposed, the method 200 finishes at operation 214 and the wafer 500 may be moved to further operations in forming the IC device. For example, the further operations may include developing the resist layer 514 and removing portions of the resist layer that are exposed to the EUV radiation beam 104 (or unexposed, depending on the type of the resist layer 514), etching the one or more layers 512 with the patterned resist layer 514 as an etch mask, forming circuit structures in the substrate 510, and so on.

If another exposure is needed, as is the case in the present embodiment after the first exposure, the method 200 (FIG. 2) goes back to operation 208 to position the wafer 500 and/or the mask 400 for a second exposure. In the present embodiment, the wafer 500 and/or the mask 400 are positioned such that the second exposure will partially overlap the first exposure on the wafer 500 and some images formed by the second exposure will be superimposed over some of the images 601-609.

Referring to FIG. 6B, nine images are formed on the wafer 500 during the second exposure with six images superimposed over the images 604-609 and three images 610-612 formed in new areas of the wafer 500. In the present embodiment, the second exposure uses a radiation dose about one third of the full radiation dose. After the first and the second exposures, the images 604-609 have been exposed to two thirds of the full radiation dose and each of them includes an image of a unit superimposed over an image of another unit. For example, the image 608 is an image of the unit 405 by the second exposure superimposed over an image of the unit 408 by the first exposure. Referring to FIG. 4A, while the unit 408 includes one of the phase defects 360, the unit 405 is substantially free of phase defects. When an image of the unit 405 is superimposed over an image of the unit 408, it acts to mitigate some printing abnormalities that may have been caused by the phase defect 360. It is apparent that the unit 405 needs not be free of phase defects, so long as it is substantially free of phase defects in an area that is to be superimposed over an area of the image 608 that has been affected by the phase defect 360 in the first exposure. Similar mitigating effect is achieved when an image of a defective unit is superimposed over an image of a defect-free unit, such as the image 606 (FIG. 6B) in the present embodiment.

Since the wafer 500 has not been fully exposed after the first and the second exposures, the method 200 (FIG. 2) repeats the operations 208 and 210 for a third exposure.

Referring to FIG. 6C, nine images are formed on the wafer 500 during the third exposure with six images superimposed over the images 607-612 and three images 613-615 formed in new areas of the wafer 500. In the present embodiment, the third exposure uses a radiation dose about one third of the full radiation dose. After the third exposure, the images 607-609 have been fully exposed and each of them is an image of three units superimposed one over another. For example, the image 608 is a superimposed image of the units 408, 405 and 402 during the first, second and third exposure respectively. The images of the units 405 and 402 act to mitigate the printing abnormalities that may have been caused by the phase defect 360 of the unit 408. Due to the mitigating effects, the images 607, 608 and 609 are considered defect-free, which means that they are acceptable within manufacturing specification, after the third exposure.

The method 200 (FIG. 2) may repeat the aforementioned operations 208 and 210 until the wafer 500 is fully exposed.

Figure 7C:
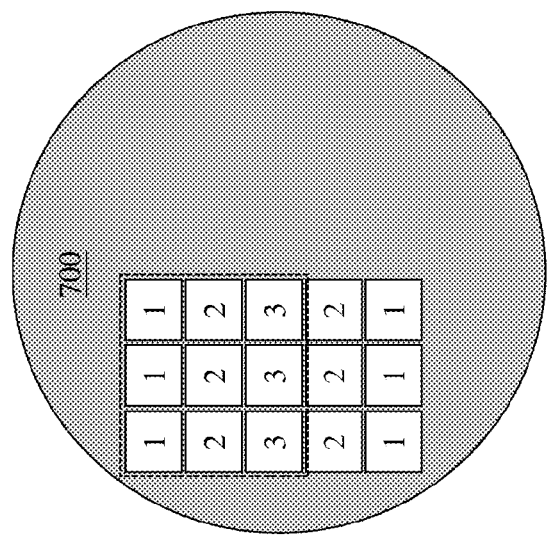
FIGS. 7A-7I illustrate another wafer multi-exposure process using a multi-unit EUV mask according to various aspects of the present disclosure.
Figure 7B:
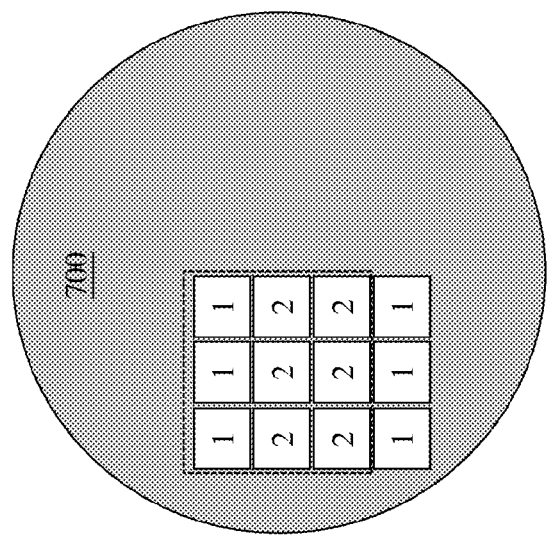
Figure 7A:
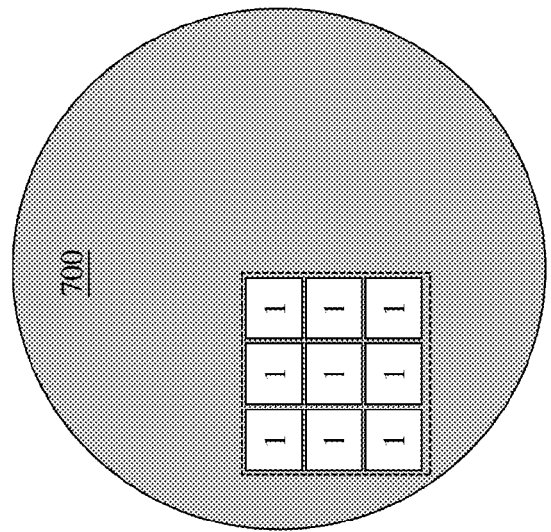
Figure 7D:
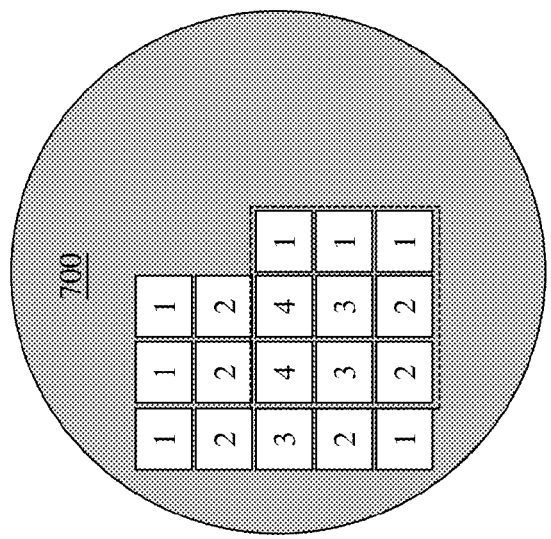
Figure 7E:
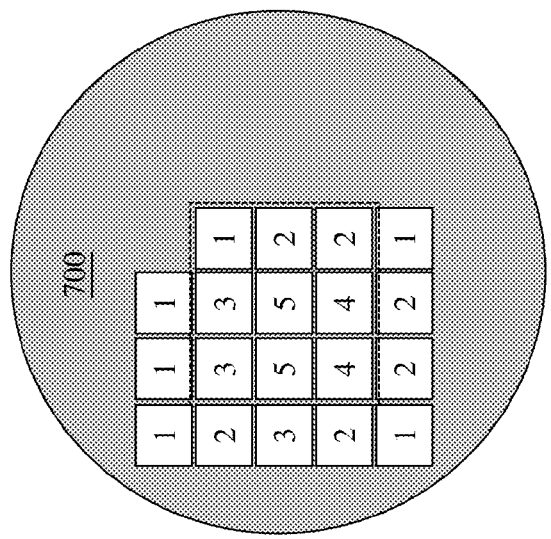
Figure 7F:
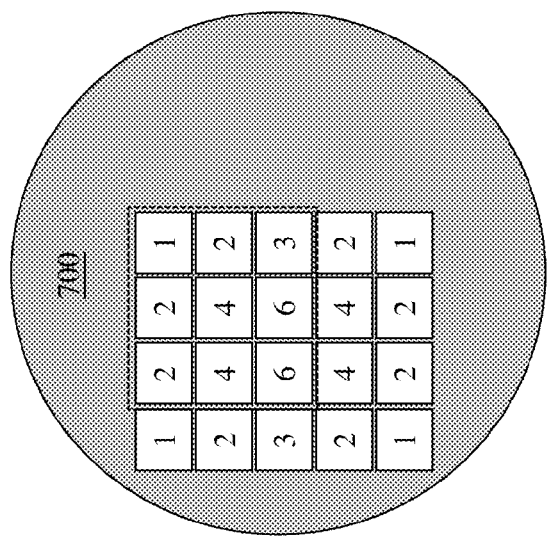
Figure 7I:
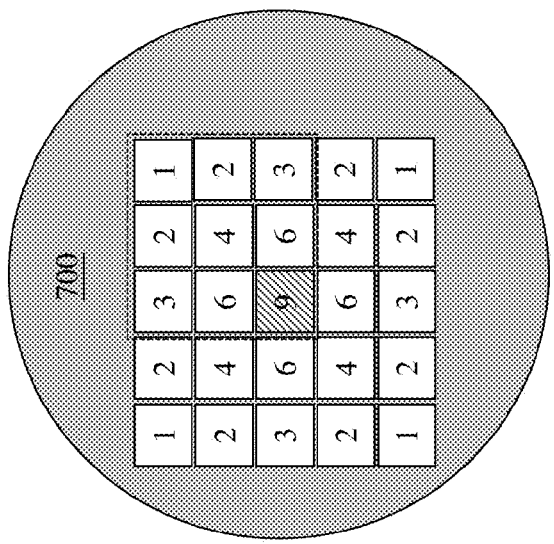
Figure 7H:
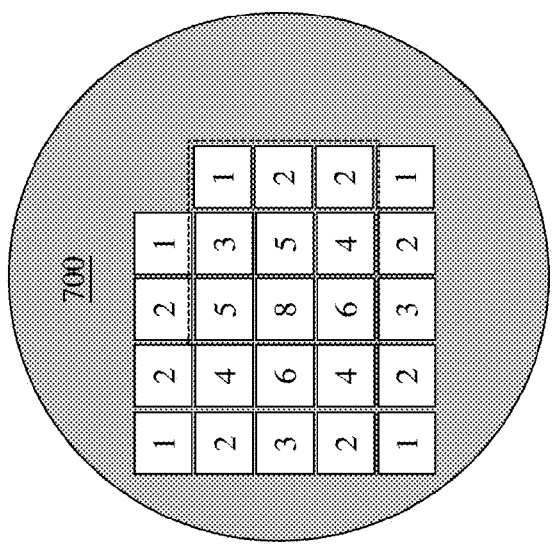
Figure 7G:
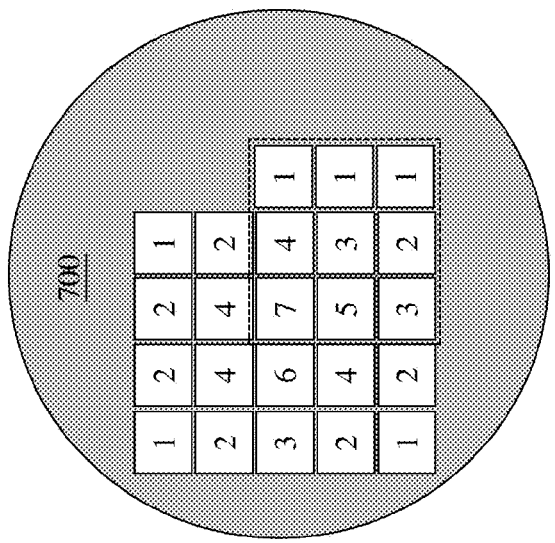

The 3×3 multi-unit configuration as shown in FIG. 4A is merely an example. In other embodiments, different multi-unit configurations, such as an array with M columns and N rows of units may be used. With such an M×N array, an EUV lithography system may employ up to K exposures, where K equals M times N, with a dose of 1/K of the full dose in each exposure. FIGS. 7A-7I illustrate one example of exposing a wafer 700 using a nine-exposure process with a mask that has a 3×3 multi-unit configuration, such as the mask 400. During each exposure, a radiation dose about one ninth of the full radiation dose is used. FIGS. 7A-7I show the wafer 700 after each of the nine exposures respectively and a number inside each image indicates the number of exposures the particular image has undergone. As shown in FIG. 7I, after the ninth exposure, at least one image has been fully exposed. Similarly, a EUV lithography system may use less than nine exposures with the 3×3 multi-unit configuration as shown in FIG. 4A. Furthermore, a radiation dose used in one exposure needs not be the same as that in another exposure.

Thus far illustrated is a system and method of fabricating IC devices using EUV lithography. The system and method generally provide benefits of enhancing pattern fidelity in spite of phase defects present in EUV masks.

In one exemplary aspect, the present disclosure is directed to an integrated circuit (IC) fabrication method. The method includes receiving a mask and a wafer, wherein the mask is includes a plurality of units and each of the units corresponds to a first pattern of an IC and the wafer includes a first substrate and a first resist layer over the first substrate. The method further includes performing a first exposure to the first resist layer using the mask thereby forming a first plurality of images on the first resist layer, wherein the first exposure uses a first radiation dose that is less than a full radiation dose and each of the first plurality of images corresponds to one of the units. The method further includes performing a second exposure to the first resist layer using the mask thereby forming a second plurality of images on the first resist layer, wherein the second exposure uses a second radiation dose that is less than the full radiation dose; each of the second plurality of images corresponds to one of the units; and a second portion of the second plurality of images is superimposed over a first portion of the first plurality of images. The first radiation dose and the second radiation dose are at least 1/N of the full radiation dose each, wherein N is the number of the units.

In another exemplary aspect, the present disclosure is directed to an integrated circuit (IC) fabrication method. The method includes receiving a mask, wherein the mask is patterned with a first pattern of an IC to form a plurality of units. A first one of the units includes defects at a first location. A second one of the units is substantially defect-free at a second location. The first and second locations correspond to a common location of the first pattern. The method further includes receiving a wafer, wherein the wafer includes a first substrate and a first resist layer over the first substrate. The method further includes performing a first exposure to the first resist layer using the mask with a first fractional radiation dose thereby forming a first plurality of images on the first resist layer, wherein a first one of the images is exposed with the first unit. The method further includes positioning the mask relative to the wafer such that a second exposure to the first resist layer using the mask would superimpose an image of the second unit over the first image for mitigating printing effects by the first unit. The method further includes performing the second exposure with a second fractional radiation dose.

In another exemplary aspect, the present disclosure is directed to an integrated circuit (IC) fabrication method. The method includes receiving a EUV mask, wherein the EUV mask includes a plurality of units and each unit is patterned with a first pattern of an IC. The method further includes receiving a wafer, wherein the wafer includes a silicon substrate and a first resist layer over the silicon substrate. The method further includes performing a first exposure to the first resist layer using the EUV mask with a first radiation dose thereby forming a first plurality of images on the first resist layer, wherein the first radiation dose is less than a full radiation dose. The method further includes positioning the EUV mask relative to the wafer such that a second exposure to the first resist layer using the EUV mask would superimpose at least one of the first plurality of images. The method further includes performing the second exposure with a second radiation dose, wherein the second radiation dose is less than the full radiation dose. The method further includes repeating the positioning operation and the performing the second exposure until at least one of the first plurality of images has been exposed to at least the full radiation dose.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a mask and a wafer, wherein the mask includes a plurality of units and each of the units corresponds to a first pattern of an IC and the wafer includes a substrate and a resist layer over the substrate;
   performing a first exposure to the resist layer using the mask;
   performing a second exposure to the resist layer using the mask, wherein a first image from the first exposure is superimposed with a second image from the second exposure, and the first and second images correspond to different ones of the units;
   repeating the performing of the second exposure until at least one image on the resist layer has been exposed to at least a full radiation dose;
   developing the resist layer; and
   etching the substrate using the developed resist layer as an etch mask.

2. The method of claim 1, wherein the first and second exposures utilize an extreme ultraviolet (EUV) radiation.

3. The method of claim 1, wherein a unit represents an image for a single die to be formed on the wafer.

4. The method of claim 1, wherein the substrate includes silicon.

5. The method of claim 1, wherein the plurality of units are arranged in an array with M columns and N rows, wherein the first exposure uses a first radiation dose less than a full radiation dose, and wherein the second exposure uses a second radiation dose less than the full radiation dose.

6. The method of claim 5, wherein:
   the M is 3 and the N is 3;
   the first radiation dose is about one third of the full radiation dose;
   the second radiation dose is about one third of the full radiation dose; and
   two thirds of images from the second exposure are superimposed over two thirds of images from the first exposure.

7. The method of claim 5, wherein the first radiation dose is about the same as the second radiation dose.

8. The method of claim 5, wherein the mask is an EUV mask and the plurality of units includes at least one phase defect.

9. The method of claim 8, wherein:
   the plurality of units includes a first unit and a second unit;
   the first unit includes a phase defect at a location of the first unit corresponding to a first location of the first pattern;

the second unit is substantially free of phase defects at a location of the second unit corresponding to the first location of the first pattern;
the first image corresponds to the first unit; and
the second image corresponds to the second unit.

10. The method of claim 8, wherein the at least one phase defect is one of: a bump defect and a pit defect.

11. A method comprising:
receiving a mask, wherein the mask is patterned with a pattern of an IC to form a plurality of units including first and second units;
receiving a wafer, wherein the wafer includes a substrate and a resist layer over the substrate;
performing a first exposure to the resist layer using the mask with a first fractional radiation dose thereby forming a first plurality of images on the resist layer, wherein a first one of the images is exposed with the first unit;
positioning the mask relative to the wafer such that a second exposure to the resist layer using the mask will superimpose an image of the second unit over the first one of the images; and
performing the second exposure with a second fractional radiation dose.

12. The method of claim 11, wherein the first and second fractional radiation doses are at least 1/N of a full radiation dose each wherein the N is the number of units on the mask.

13. The method of claim 11, wherein the second fractional radiation dose is about the same as the first fractional radiation dose.

14. The method of claim 11, further comprising:
repeating the positioning of the mask and the performing of the second exposure until at least one of the first plurality of images has been exposed to at least a full radiation dose;
developing the resist layer; and
etching the substrate with the developed resist layer as an etch mask.

15. The method of claim 11, wherein the substrate includes silicon.

16. The method of claim 11, wherein the mask is a EUV mask having a phase defect.

17. A method comprising:
receiving a mask, wherein the mask includes a plurality of die-layer images (dies) and each die is patterned with a first pattern of an IC;
receiving a substrate and a resist layer over the substrate;
performing a first exposure to the resist layer using the mask with a first radiation dose thereby forming a first plurality of images on the resist layer, wherein the first radiation dose is less than a full radiation dose;
positioning the mask relative to the substrate such that a second exposure to the resist layer using the mask will superimpose at least one of the first plurality of images;
performing the second exposure with a second radiation dose, wherein the second radiation dose is less than the full radiation dose; and
repeating the positioning of the mask and the performing of the second exposure until at least one of the first plurality of images is exposed to at least the full radiation dose.

18. The method of claim 17, further comprising:
developing the resist layer; and
etching the substrate with the developed resist layer as an etch mask.

19. The method of claim 17, wherein:
the plurality of dies includes a first die and a second die;
the first die includes a phase defect at a location of the first die corresponding to a first location of the first pattern;
the second die is substantially free of phase defects at a location of the second die corresponding to the first location of the first pattern;
a first image of the first plurality of images is an image of the first die;
a second image from the second exposure is an image of the second die; and
the second image is superimposed over the first image by the second exposure.

* * * * *